United States Patent [19]

Elshuber et al.

[11] 4,004,231
[45] Jan. 18, 1977

[54] AFC CIRCUIT

[75] Inventors: Karl Elshuber; Laszlo Gotz, both of Freising, Germany

[73] Assignee: Texas Instruments Incorporated, Dallas, Tex.

[22] Filed: May 21, 1975

[21] Appl. No.: 579,653

[30] Foreign Application Priority Data

May 21, 1974 Germany ............................ 2424613

[52] U.S. Cl. .............................. 325/420; 325/464; 325/469
[51] Int. Cl.² ........................................ H04B 1/16
[58] Field of Search .......... 325/416, 417, 419, 418, 325/423, 453, 464, 469, 470; 178/5.8 AF

[56] References Cited

UNITED STATES PATENTS

| 3,649,919 | 3/1972 | Fridman | 325/418 |
| 3,903,433 | 9/1975 | Leuschner | 325/464 |
| 3,916,179 | 10/1975 | Cuzzo | 235/183 |

Primary Examiner—Richard Murray
Assistant Examiner—Michael A. Masinick
Attorney, Agent, or Firm—Harold Levine; James T. Comfort; Richard L. Donaldson

[57] ABSTRACT

A circuit arrangement for automatic fine tuning of a broadcast receiver to an assigned transmission frequency. The receiver has an input stage which can be tuned over a desired receiving frequency range by a variable control voltage fed to the input stage. The input stage feeds a discriminator having an S-shaped output signal characteristic and producing an output signal having a given nominal value when the input stage is tuned to the assigned frequency. A first variable frequency clock generator is controlled by a control signal depending on the output signal of the discriminator and feeds an up/down counter the count of which is converted by a digital-analog converter into the control voltage for the input stage. The first clock generator is so designed that its output signal frequency varies constantly in dependence on the deviation of the discriminator output signal from the nominal value, and that it has a zero value when the discriminator output signal has the nominal value. The first clock generator operates the counter only when the input stage has become tuned to a frequency within a certain range of the selected frequency. Outside this range, the counter is clocked by a fixed high frequency clock generator. An image frequency detector is connected to the discriminator output for generating a disabling signal when the input stage is tuned to an image frequency, the disabling signal being applied to prevent switching from the fixed frequency clock generator to the variable frequency clock generator.

12 Claims, 5 Drawing Figures

AFC CIRCUIT

The invention relates to a circuit arrangement for the automatic fine tuning of a broadcast receiver to an assigned frequency with an input stage, which can be tuned over a desired receiving frequency range by means of a variable control voltage fed to a control input. In such a circuit, the input stage may feed a discriminator whose output signal has a given nominal value when the input stage is tuned to the assigned frequency. A clock generator is controlled by a control signal depending on the output signal of the discriminator and feeds an up/down counter. A digital-analog converter converts the count of the counter into the control voltage which is fed to the control input of the input stage.

In a known circuit arrangement of this type, the counter whose count is converted into the control voltage fed to the control input of the input stage is clocked by the clock generator with a high frequency when the input stage is tuned to a frequency deviating greatly from the assigned frequency. In this case the discriminator produces an output signal whose value differs greatly from the nominal value. When the output signal of the discriminator approaches the nominal value, the clock generator is switched to a lower clock frequency so that the tuning of the input stage to the assigned frequency is slowed down. When the output signal of the discriminator finally attains the nominal value, the clock generator is disabled, so that the count of the counter is no longer changed.

The clock generator is also switched to the lower frequency if the output signal of the discriminator indicates that the input stage is tuned to a frequency which is in a given range above the assigned frequency. In this case, however, the clock signal is fed to the down counting input of the counter, so that an approach to the nominal value is likewise achieved. The switching of the clock generator from the high to the low clock frequency is thus always effected when the input stage is tuned to a given range below or above the assigned frequency.

In order to make sure that the tuning process does not take up too much time, the lower clock frequency needs to be relatively high, and this leads to overshoot of the selected frequency, that is, the input stage is tuned to a frequency above the assigned frequency when approaching from lower frequency values, and to a frequency below the assigned frequency when approaching from higher frequency values. This overshoot causes the counter to change its direction of counting and the assigned frequency is finally attained, but this overshoot can repeat several times so that the tuning process is greatly extended. In certain circumstances, a state of oscillation may even occur, as a result of which the correct assigned frequency is not reached at all.

In order to permit exact tuning of the input stage to the assigned frequency in such circuit arrangements, the gap between the two ranges in which the counter counts, up or down, with the lower clock frequency, should be kept as small as possible. The disablement of the counter in this gap should be effected exactly at the counter reading at which the input stage is tuned precisely to the assigned frequency. The smaller the gap between the two ranges, however, the more critical are the tolerances of the parts of the circuit arrangement which analyze the output signal of the discriminator and effect the switching and disablement of the clock generator.

The invention is concerned with design of a circuit arrangement of the above described type so that a precise fine tuning to the desired assigned frequency is achieved very rapidly, without the risk of overshoot and without close tolerance requirements for the various circuit components.

According to the invention, the clock generator is so designed that the frequency of its output signal varies constantly in dependence on the deviation of the discriminator output signal from the nominal value, and that it has the value zero when the discriminator output signal has the nominal value.

When a tuning process is carried out by a circuit arrangement according to the invention, the counter is clocked at a high clock frequency as long as the input stage is tuned to frequency values which are remote from the assigned frequency. When the discriminator output signal indicates an approach of the tuning to the selected frequency, the clock frequency from the clock generator varies at a constant rate until it has finally a zero value when the discriminator output signal has attained the required nominal value. Since the frequency of the clock generator output signal varies at a constant rate toward the zero value, it is not necessary to disable the clock generator output signal by a separate switching operation. A marked overshoot caused by such a switching operation, thus is prevented. Since the range in which the frequency of the clock generator output signal slows down considerably from the initially high clock frequency can be kept small, the tuning process is not time consuming, so that the receiver is tuned rapidly to the desired frequency by using a circuit arrangement according to the invention.

In an advantageous embodiment of a circuit arrangement according to the invention the clock generator includes a current source controlled by the control signal, to the output of which is connected a capacitor. A switching element is arranged parallel to the capacitor which switches into a conductive state when the voltage on the capacitor exceeds a given threshold value, and switches into an open state when the current flowing in the transmitting state drops below a given holding current value. The switching element feeds to the output of the clock generator an output signal depending on its switching state.

In this embodiment of the invention, the capacitor is charged faster or slower depending on the amplitude of the control signal. Whenever the capacitor becomes charged to the predetermined threshold voltage, discharge of the capacitor is commenced, and the charging can only start again when the current flowing through the switching element has dropped below a given holding current value. The successive switching between a conductive state and an open state of the switching element controls the frequency of the signal at the output of the clock generator.

In order to obtain a wide scatter range, it is desirable to design the current source so that it is capable of supplying current values which are substantially higher than the given holding current value. If the current source generates such a high current, however, the switching element could no longer be switched into its open state, since the current would no longer drop below the holding current value. In order also to permit in this case, switching of the switching element into the open state, an electronic switch is connected in an advantageous manner according to a feature of the invention, parallel to the controllable switching element, which switches into its conductive state in the conductive state of the switching element. When the electronic switch switches into its conductive state, the majority of the current supplied by the current source flows off through it, so that the current flowing through the switching element drops at any rate below its holding current. The switching element can thus switch again into its open state, so that the charging of the capacitor can start again.

A control circuit designed as a comparator circuit is advantageously arranged between the discriminator and the clock generator, which compares the discriminator output signal with a fixed reference voltage and generates the control signal in dependence on the result of the comparison.

Furthermore, a circuit arrangement embodying the invention may with advantage be so designed that a clock generator working constant clock frequency is associated with the up/down counter. The control circuit generates a switching signal, depending on whether the discriminator output signal is in a given range below or above the nominal value, and a switching unit is arranged between the clock generator and the counter which disconnects the clock generator in dependence on the switching signals and applies the output signal of the clock generator either to the up counter input or to the down counter input of the counter. In this embodiment of the invention, the counter is normally timed by its own second clock generator and the first clock generator takes over the stepping up of the counter only when the input stage has become tuned to a frequency within a certain range above the selected frequency. The input stage can be tuned at first very rapidly until finally the above mentioned range above the selected frequency is reached in which the frequency of the first clock generator is varied at a constant rate until it attains the zero value.

Furthermore, it is advantageous that the input stage includes a mixing stage which mixes the transmitted signal received by the receiver with the output signal of its heterodyne oscillator, and that an image frequency detector is connected to the output of the discriminator which is so designed that it generates a disabling signal when the input stage is tuned to an image frequency, thereby preventing switching from the second clock generator to the first clock generator.

In an advantageous embodiment of the invention, the discriminator is so designed that its output signal has an S-shaped characteristic with a negative curve leg when the input stage is tuned to a frequency value below the frequency associated with a certain transmitter, and a positive curve leg when the input stage is tuned to a frequency value above this frequency. Its characteristic when receiving an image frequency has a reverse S-shape. The image frequency detector contains a first flip-flop circuit which generates in one state at its output a switching signal effecting the switching from the second clock generator to the first clock generator. The first flip-flop circuit is preceded by a first threshold value circuit which generates a signal when a negative curve leg is received in the output signal of the discriminator which switches the first flip-flop circuit into a state in which it generates the switching signal. A second flip-flop circuit is provided which can be disabled by the switching signal, and the second flip-flop circuit is preceded by a second threshold value circuit which generates a signal when receiving a positive curve leg in the output signal of the discriminator which switches the second flip-flop circuit, unless it is disabled, into a state in which it generates a signal that keeps the first flip-flop circuit in a state in which it generates the disabling signal.

Since a positive curve leg in the output signal of the discriminator, which is used to recognize an image frequency, also appears when the tuning process of the input stage is started, after the latter has already been tuned to a true assigned frequency, the next negative curve leg of the S-curve of the discriminator output signal would be identified in such a tuning process as a leg appearing during the tuning to an image frequency, though it is the first leg of an S-curve appearing during the tuning to a true assigned frequency. This wrong identification would have the result that the tuning of the input stage to this correct frequency would be prevented.

In order to eliminate this false behavior, a coincidence circuit is provided which generates a coincidence signal if synchronizing pulses in the video signals received from the television receiver, which are supplied from a synchronizing pulse input, coincide with line flyback pulses supplied from a flyback pulse input. A third flip-flop circuit is provided in the image frequency detector which generates a disabling signal in dependence on the coincidence signal as well as a signal indicating the level of the video-signal received, which disables the second flip-flop circuit. This design has the effect that the first positive leg of the S-curve in the discriminator signal has no effect in the image frequency detector when the tuning process is started from a rated frequency. In order to recognize this special starting point, the disabling of the second flip-flop circuit is also made dependent on the coincidence signal and on the signal indicating the level of the video signal received, since these two signals appear only when the input stage is tuned to a true assigned frequency.

In order that the invention may readily be put into effect, and to illustrate further advantages thereof, an embodiment thereof will be described in more detail, by way of example, with reference to the drawings, wherein.

Figure 1:
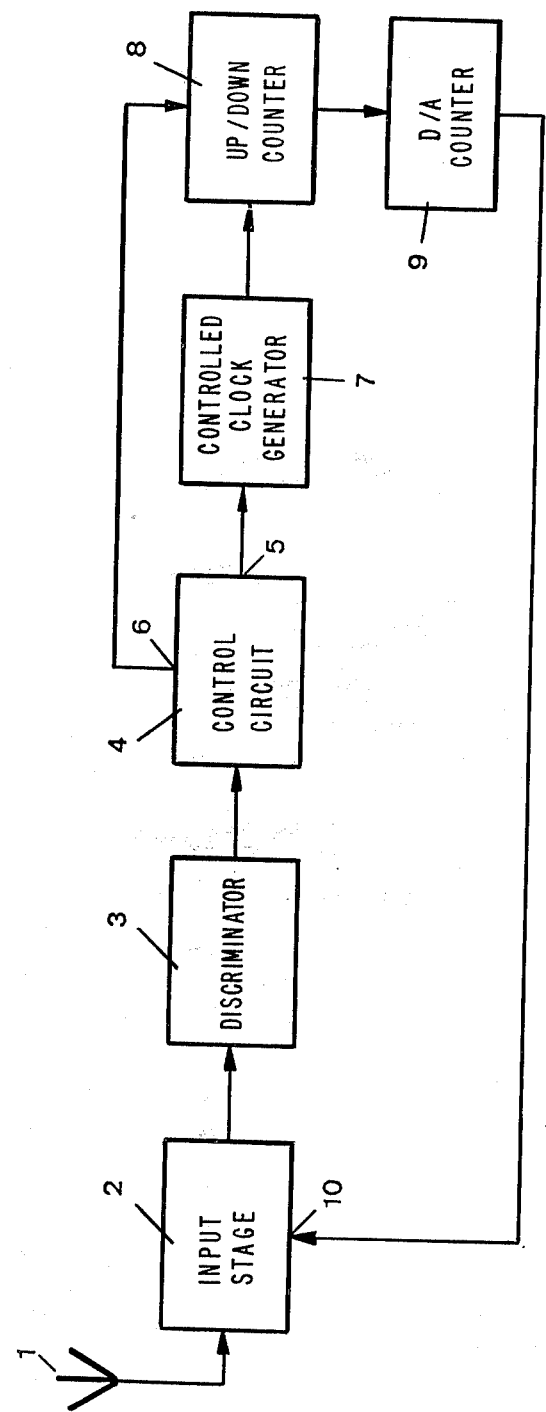
FIG. 1 shows a block circuit diagram of a conventional tuning circuit.

In order to facilitate understanding of the invention, a conventional tuning circuit will first be described on the basis of FIG. 1. In this circuit arrangement, a HF-signal received from an antenna 1 is fed to an input stage 2 whose output signal is evaluated in a discriminator 3, the output signal of the discriminator is fed to a control circuit 4 which produces at an output 5 output signals which indicate whether the input stage is tuned to the assigned frequency or to a frequency which is in a certain range above or below the assigned frequency. At another output 6 the control circuit 4 produces a signal which indicates whether the input stage is tuned to a frequency above or below the rated frequency.

The signal produced at the output 5 of the control circuit 4 is fed to a controllable clock generator 7 which is so designed that it switches from a constant high clock frequency to a constant lower clock frequency whenever this signal appears. When the signal at the output 5 indicates that the input stage is tuned to the assigned frequency, the clock generator 7 is disabled.

The clock signal from the controllable clock generator 7 is fed to an up/down counter 8 which counts up or down in dependence on the signal produced at the output 6 of the control circuit 4. The respective count of the counter is converted by a digital analog converter 9 into an analog control voltage which is fed to a control input 10 of the input stage 2. The control voltage fed to the input 10 effects the tuning of the input stage as known in the art.

The above mentioned two frequency ranges which are above and below the assigned frequency must lie in a very small frequency interval on both sides of that frequency, so that, when the clock generator 7 is disabled, the count of the counter 8 is reached exactly at which the control voltage produced by the digital analog converter 9 tunes the input stage 2 exactly to the assigned frequency. The closer the two frequency ranges are on both sides of the assigned frequency, the more difficult is it to stop the counter exactly at the desired count. Often, the tuning will overshoot to the other side of the assigned frequency. This has the effect that the signal at the output 6 of the control circuit 4 causes the counter to change its counting direction, so that the input stage is tuned this time in the other tuning direction toward the assigned frequency. The counting direction of the counter may change several times in this manner, which considerably extends the time required to achieve proper tuning. An unstable state may also appear in which there is a constant change of the counting direction without the counter being disabled.

Figure 2:
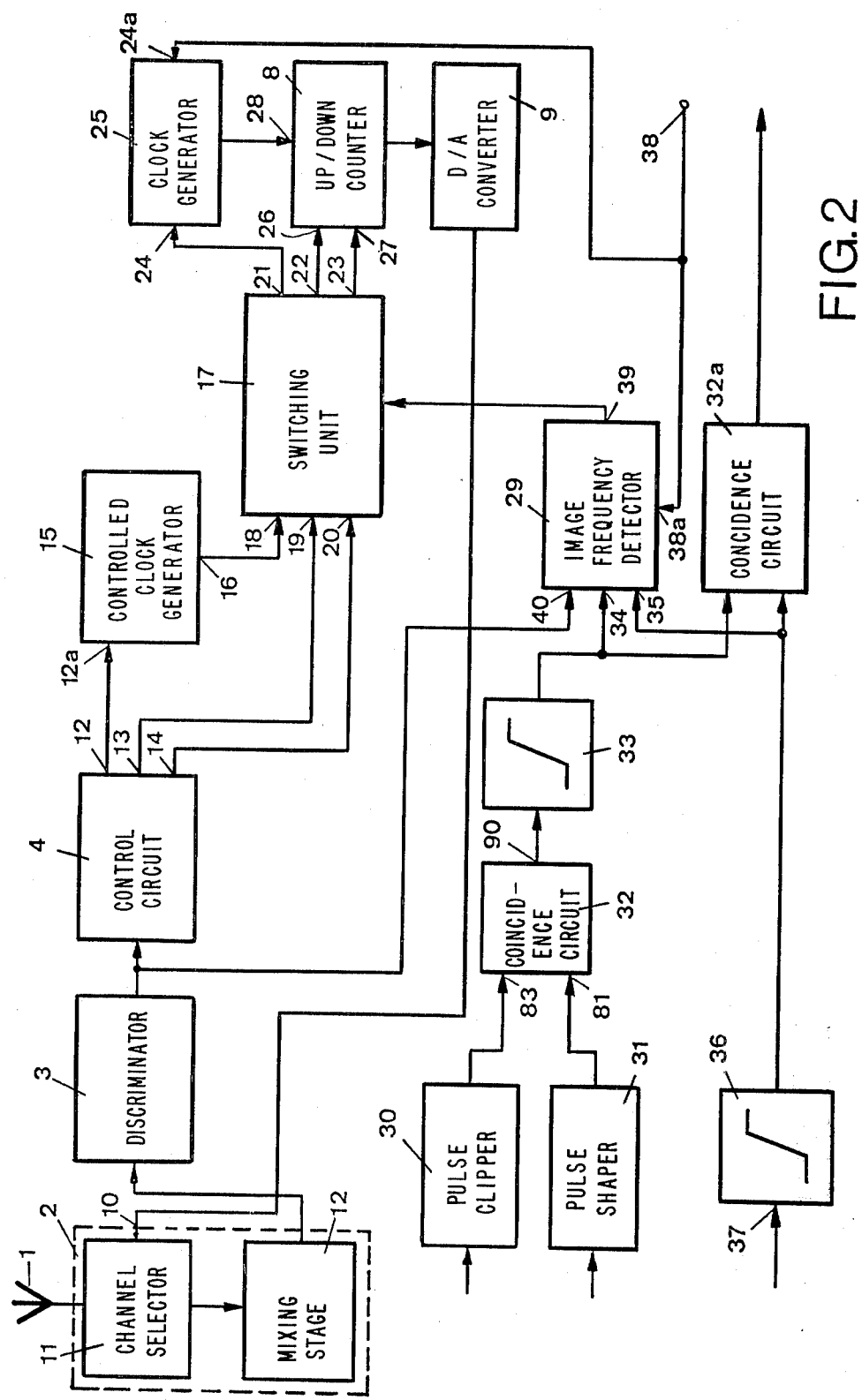
FIG. 2 shows a block circuit diagram of a circuit arrangement according to the invention.

In an embodiment of the invention as represented in FIG. 2, which is suitable for use in a television receiver, the input stage 2 contains a channel selector 11 and a mixing stage 12 in which the HF-signal received by the antenna 1 is mixed with the output signal of a heterodyne oscillator contained in this stage. The output signal of the mixing stage 12 is evaluated in the discriminator 3. The discriminator 3 is so designed that it produces a substantially S-shaped output signal which during the tuning of the input stage 2 to a true transmitter frequency below the assigned frequency has a negative curve leg; at the assigned frequency a nominal value defined here as the zero crossing; and above the assigned frequency a positive curve leg.

The control circuit 4 which receives the output signal of the discriminator 3, generates at the output 12 a control signal which indicates the deviation of the existing tuning frequency of the input stage from the assigned frequency. At the outputs 13 and 14 the control circuit produces switching signals which indicate whether the discriminator output signal is in a given range below or above the zero crossing.

The control signal at the output 12 of the control circuit 4 is fed to a controllable clock generator 15 which produces a clock frequency whose value varies constantly with the value of the control signal.

A switching unit 17 receives at the input 18 the output signal of the clock generator 15 and at the inputs 19 and 20 the switching signals from the outputs 13 and 14 of the control circuit 4. The switching unit 17 has three outputs 21, 22 and 23 of which output 21 is connected to the stop input 24 of a clock 25 and outputs 22 and 23 are respectively connected to the up/down counter 8. The clock generator 25 can feed up-counting pulses to the up/down counter 8 over the input 28.

The respective reading of the counter 8 is converted in the digital-analog converter 9 into a corresponding analog control voltage which is fed to the control input 10 of the input stage 2.

In known manner, the intermediate frequency in the mixing stage is produced by mixing the incoming frequency with the frequency of a heterodyne oscillator. The intermediate frequency is then obtained when the heterodyne oscillator oscillates at a frequency defined by the distance of the intermediate frequency above or below the received frequency. The frequency of the heterodyne oscillator above the received frequency is assumed to be a true frequency, while the frequency of the heterodyne oscillator below the received frequency is assumed to be an undesired image frequency.

The discriminator 3 also supplies in the evaluation of image frequencies an S-shaped output signal but this output signal has frequencies below the image frequency at first a positive curve leg and after the zero crossing in a negative curve leg. This curve which is characteristic of an image frequency, is recognized in an image frequency detector 29 and used to prevent the forced tuning of the input stage 2 to an image frequency.

To make sure that the input stage 2 can only be tuned to an assigned frequency when the synchronizing pulses received and the line flyback pulses appearing in the television receiver are synchronous, the synchronizing pulses from a pulse clipping stage 30 and the line flyback pulses from a pulse shaper 31 are checked in a coincidence circuit 32 to determine whether the required synchronism exists. The signal appearing at the output 90 of the coincidence circuit 32 is fed to a threshold value circuit 33 which responds when a certain threshold value is attained and applies a signal to the image frequency detector input 34 for a purpose to be described below. Furthermore, the output signal of the threshold value circuit 33 is fed to another coincidence circuit 32a together with a signal from the threshold value circuit 36, which indicates whether a video signal is received with a corresponding level. The output signal of the coincidence circuit 32a is used in known manner in the receiver to continue the through-tuning process if the quality required for a satisfactory reception is not achieved. This AVR signal indicating the level of the received video signal is also fed to an input 35 of the image frequency detector 29 for a purpose to be described below.

The method of operation of the circuit arrangement represented in FIG. 2 will be described, assuming that the input stage 2 is tuned to the lowest frequency value of a desired frequency band to be scanned. In order to start the scan-tuning process, a starting signal is applied to a start input 38, which is fed to a start input 24a of the clock generator 25, so that the latter begins to feed to the counter 25 up-counting pulses with a constant high clock frequency.

At the start of the scan-tuning process the output signal of the discriminator 3 is not within a given range above and below the required zero crossing, so that the control circuit 4 produces no switching signal at its outputs 13 and 14. The control circuit 4 already produces a control signal at its output 12, but the timing signal produced by the timing generator 15 in dependence on this control signal in ineffective, because the switching unit 17 prevents in this operating state the transmission of the clock signals from the clock generator 15 to the counter 8. In this operating state, the counter 8 is thus clocked by the clock generator 25 with a high clock frequency. The control voltage from the digital analog converter 9 characterizing the counter reading attained tunes the channel selector 11 through at high speed.

If the output signal of the discriminator now assumes a value which is in given range below the zero crossing which indicates that the tuning state of the channel selector 11 approaches the tuning to a true transmitter, the control circuit 4 generates at the output 13 a signal which characterizes this state. At the same time the image frequency detector 29 generates in dependence on the output signal of the discriminator 3 supplied by its input 40 a switching signal at the output 39 which has the effect in the switching unit 17 that the switching signal at the input 19 cuts off the clock generator 25 and starts the up-counting of the counter 8 by the clock signal from the clock generator 15 supplied to the input 18. Since the switching signal at the output 13 of the control circuit 4 indicates that the discriminator output signal is in a given range below the zero crossing, the output signal of the clock generator 15 is fed by the switching unit 17 to the up-counting input 26 of the counter 8. The counter 8 is thus no longer clocked with the constant clock frequency from the clock generator 25, but with the clock frequency from the clock generator 15, which varies constantly in dependence on the control signal from the control circuit 4. The closer the output signal of the discriminator 3 approaches the zero crossing, and the tuning of the channel selector 11 thus approaches the true transmitter frequency, the slower is the clock frequency supplied by the clock generator 15. It finally assumes the zero value when output signal of the discriminator 3 reaches the zero crossing. The control voltage from the digital analog converter 9 supplied to the control input 10 of the input stage 2, which does not change its value any more since the count of the counter 8 does not change, keeps the channel selector 11 tuned to the required assigned frequency.

Assume now that the tuning frequency of the channel selector 11 changes due to outside influences, e.g., temperature fluctuations. The discriminator 3 again produces an output signal differing from the zero value, so that the control signal from the control circuit 4 causes the clock generator 15 again to produce timing signals. When the tuning frequency drops below the assigned frequency, the switching signal at the output 13 of the control circuit effects the supply of clock signals from the clock generator 15 to the up counting input 26 of the counter 8, while, then the tuning frequency rises above the assigned frequency, a switching signal is produced by the control circuit 4 at the output 14, which has the result that the output signal of the clock generator 15 is fed to the down-counting input 27 of the counter 8. Depending on the deviation of the tuning frequency from the assigned frequency, the count of the counter 8 is so varied that the control voltage generated by the digital analog converter 9 returns the channel selector again to the assigned frequency. This fine tuning process is only ended when the control signal from the control circuit 4 indicates that the discriminator output signal has again the zero value.

Assume now that the output frequency of the input stage 2 is generated by an image frequency. As mentioned above, the discriminator 3 then produces an S-shaped output signal which has at first a positive curve leg. This positive curve leg is recognized by the image frequency detector 29 so that as a reaction thereto, the blocking signal appears again at its output 39, which causes the switching unit 17 to prevent the switching from the clock generator 25 to the clock generator 15. The clock generator 25 thus continues to clock the counter 8 with a high frequency, although the output signal of the discriminator 3 has the zero crossing value during the tuning of the input stage 2 to the image frequency. Tuning to an image frequency is thus not possible. The input stage 2 is therefore scan-tuned further until a true assigned frequency is achieved.

A missing synchronization between the synchronizing pulses and the line flyback pulses, as well as an inadequate video signal receiving level in the receiver have likewise the result that fixed tuning to the transmitter just being received is prevented, since the coincidence circuit 32a produces a signal which produces this effect in the receiver. The input stage 2 can thus not be maintained tuned to a transmitter signal which is received with a quality that is insufficient for an adequate reception.

If the scan tuning of the input stage 2 is started when the input stage was already tuned to a true assigned frequency, the output signal of the discriminator 3 immediately traverses the positive leg of the S-curve. As mentioned above, the image frequency detector 29 would evaluate the fist negative curve leg after the passage through the first positive curve leg, as the second half of the S-curve which appears at the tuning to an image frequency so that the blocking signal would appear at its output 39. It order to make sure that the negative curve leg following the positive curve leg does not have the effect of the negative curve leg of the S-curve in the tuning to an image frequency, means are provided in the image frequency detector which prevent the first positive curve leg appearing at the start of a scan-tuning process from becoming effective. These means are effective when the starting signal appears at the start input 38 when the ARV signal indicating the level of the videosignal received appears at the input 35 of the image frequency detector 29, and when coincidence signal indicating the coincidence between the synchronizing pulses and the line flyback pulses appear at the input 34 of the image frequency detector 29. This simultaneous appearance of the above mentioned signals is only possible during the passage of the positive leg of the S-curve in the output signal of the discriminator 3 at the start of the scan-tuning process of an assigned frequency.

Figure 3:
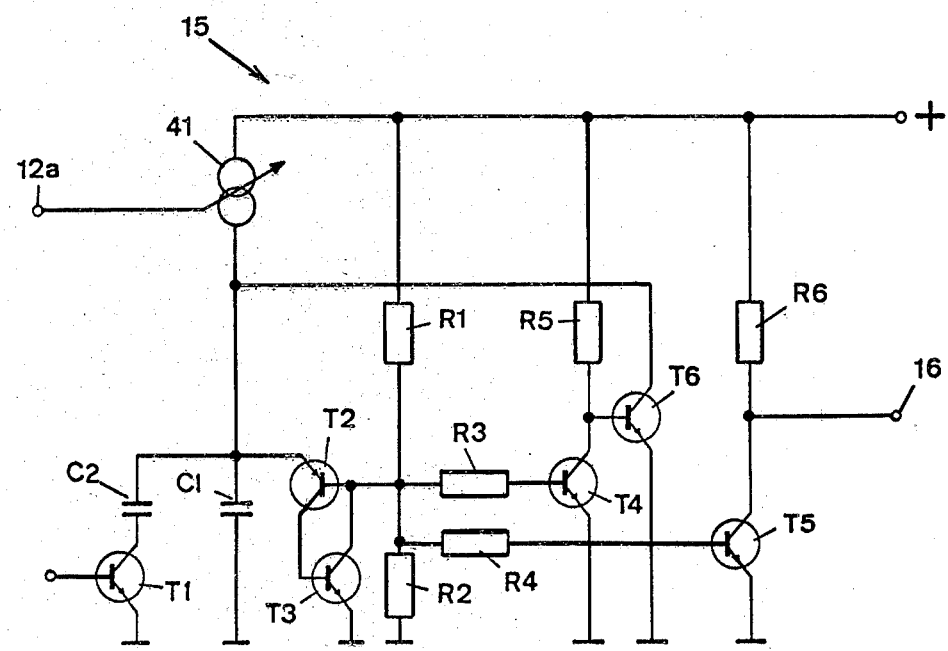
FIG. 3 shows a circuit diagram of a controllable timing generator suitable for use in FIG. 2.

FIG. 3 shows a circuit diagram for the clock generator 15. The input 12a of the clock generator 15 leads to the control connection of a controllable current source 41 which generates more or less current in dependence on the size of the control signal supplied to it. A terminal of the current source 41 is connected to the positive terminal of supply voltage source, while the other terminal of the current source is connected over a capacitor C1 to ground. Another capacitor C2 can be connected in parallel with the capacitor C1 by means of a npn switching transistor T1.

Also connected in parallel to the capacitor C1 are two complementary transistors T2 and T3 which are connected with each other in the manner of a four-layer diode. This means that the collector terminals of the two transistors T2 and T3 are connected to the base terminals of the respective other transistor, while the emitter of the transistor T2 is connected to the junction between the current source 41 and the capacitor C1, and the emitter of the transistor T3 to ground.

Connected to the base of the transistor T2 is also the junction of two resistors R1 and R2 arranged in series between the positive terminal of the supply voltage source and ground, as well as two series resistors R3 and R4. The other ends of the series resistances R3 and R4 are connected to the base terminals of two npn transistors T4 and T5. The collector of transistor T4 is connected over a load resistor R5 to the positive terminal of the supply voltage source, and it is connected directly to the base of another npn transistor T6. The emitter of transistor T4 is grounded, like the emitter of the transistor T5 and T6. The collector of transistor T6 is connected directly to the junction between the current source 41 and the capacitor C1. Clock signals from the clock generator 15 are derived from a collector output terminal of the transistor T5, which is connected over the load resistor R6 with the positive terminal of the supply voltage source.

The clock generator 15 operates as follows:

Assume that the transistor T1 is blocked (off) so that the output current of the current source 41 charges the capacitor C1 exclusively. The capacitor C1 is charged slowly, until its voltage has attained a threshold value determined by the bias voltage resistors R1 and R2, when the arrangement of the two transistors T2 and T3 switches into a conductive state. The transistors T4 and T5 thus cease to receive any base voltage, so that they switch into a non-conductive blocking state. Due to the non-conductive state of the transistor T4, transistor T6 switches into a conductive state, so that the current supplied from the current source 41 can flow to the ground over transistor T6. This has the result that the charging voltage on the capacitor C1 drops to almost zero (0) volts.

Since the current from the current source 41 no longer flows exclusively through transistors T2 and T3, but also flows through transistor T6 to ground, the current through transistors T2 and T3 drops below the holding current value, switching these two transistors into the off state. The transistors T4 and T5 again become conductive, and due to the conductive state of transistor T4, transistor T6 is switched off again. The current from the current source 41 again charges the capacitor C1.

Since transistor T5 switches alternately from the conductive to the non-conductive state in dependence on the respective switching state of the transistor pair, T2 and T3, a pulse-shaped output signal is generated at the output 16 of the clock generator 15 which can be used as a timing signal for starting the up/down counter 8.

The transistor T6 is of particular importance in the clock generator 15 represented in FIG. 3. The current source 41 cannot have a value exceeding the holding current of the transistor pair T2, T3 without the transistor T6, otherwise after having been initially switched to a conductive state, the transistor pair T2, T3 could not be switched to an off state since the current could not be reduced below the holding current value. The modulation range of the current source 41 therefore has an upper limit defined by the holding current value of the transistor pair T2 and T3. But with the limitation of the control range of the current source 41, the frequency range of the timing signal generated at the output 16 is likewise limited, since the charging time of the capacitor C1, which substantially determines the frequency of the timing signal at the output 16, would only be variable in a narrow range.

To make sure that the current drops below the holding current value even when the current source 41 supplies a substantially higher current than this holding current, transistor T6 is connected in parallel with the transistor pair T2 and T3, so that the current from the current source 41 can be bypassed to ground through transistor T6 in its conductive state. The charging voltage on the capacitor C1 can therefore drop approximately to 0 volts, even at high current values from the current source 41, so that it drops in any case below the holding current value of the transistor pair T2 and T3. The control range of the current source 41 is thus substantially increased, which naturally also results in a corresponding increase of the frequency range of the timing signal at the output 16.

Switching of the frequency range of the timing signal at the output 16 to a smaller frequency range can be effected by switching transistor T1 to a conductive state to connect the capacitor C2 in parallel to the capacitor C1. This is utilized in the switching from the UHF to the VHF range in a television receiver to compensate for the different tuning slopes in these ranges.

Figure 4:
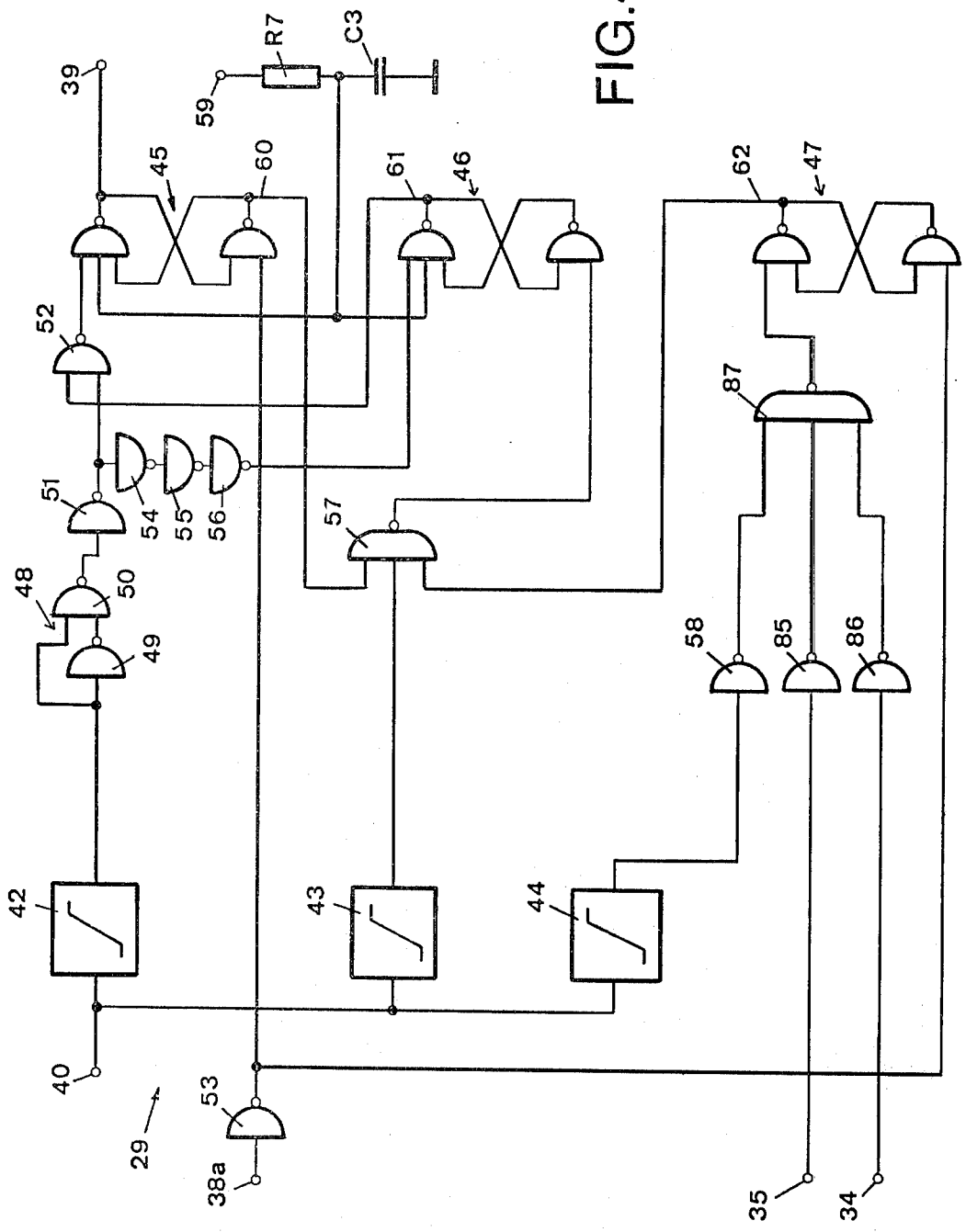
FIG. 4 shows a circuit diagram of an image frequency detector suitable for use in FIG. 2.

FIG. 4 shows a logic diagram of the image frequency detector 29. The image frequency detector 29 contains three threshold value circuits 42, 43 and 44, of which the threshold value circuit 42 responds to the negative curve leg of the discriminator output signal, while the threshold value circuits 43 and 44 respond to the positive curve leg of the discriminator output signal.

The image frequency detector 29 also contains three flip-flop circuits 45, 46 and 47. One output of the flip-flop circuit 45 is connected to the output 39 of the image frequency detector. Sweep signals can be fed to the flip-flop circuit 45 over a differentiator 48 comprising two NAND-circuits 49 and 50, over NAND-circuits 51 and 52, as well as over an additional NAND-circuit 53. The supply of sweep signals to the flip-flop circuit 46 is effected over a delay network of three NAND-circuits 54, 55 and 56, as well as over a NAND-circuit 57. Sweep signals for switching the flip-flop circuit 47 are supplied over the NAND-circuits 53, 58, 85, 86 and 87.

The two flip-flop circuits 45 and 46 can also be controlled by a sweep signal generated by a differentiator comprising resistor R7 and capacitor C3.

When the image frequency detector 29 is switched on, so that the terminal 59 is connected to the terminal of the supply voltage source, the flip-flop circuits 45 and 46 are set by the pulse obtained from the differentiator R7, C3 as a result of the switch-on transient, so that they feed to the output 39 of the image frequency detector 29 the switching signal which actuates the switching unit 17 to switch from the clock generator 25 to the clock generator 15. When the input stage 2 is tuned to an assigned frequency, the count of the counter 8 is not increased, apart from a fine tuning to compensate undesired fluctuations. The input stage thus remains tuned to this assigned frequency.

By applying the scan-tuning starting signal to the input 38a of the image frequency detector 29, the flip-flop circuit 45 is switched to a state in which it produces a blocking signal at the output 39. This means that the counter 8 is now stepped up at the high frequency of the clock generator 25, likewise started by the starting signal, and that the input stage 2 is accordingly scan-tuned. As soon as the output signal of the discriminator 3 fed to the input 40 passes through a negative curve leg, which indicates the approach to an assigned frequency, the threshold value circuit 42 responds and supplies an output signal to the differentiating element 48 to generate a pulse which switches the flip-flop circuit 45 into a state producing a switching signal at the output 39. The signal appearing in this state at the output 60 of the flip-flop circuit 45 is fed to the NAND-circuit 57; this has the effect that the response of the threshold value circuit 43 to the positive curve leg following the negative curve leg in the discriminator output signal cannot lead to the switching of the flip-flop circuit 46. The flip-flop circuit 46 thus remains in the state in which it was put when the image frequency detector 29 was switched on.

But if a positive curve leg appears first in the discriminator output signal when the input stage 2 is scan-tuned, which indicates approach to an image frequency, the threshold value circuit 43 responds so that is produces an output signal which switches the flip-flop circuit 46 over the NAND-circuit 57. Due to this switching, a signal is generated at the output 61 of the flip-flop circuit 46 which prevents, by blocking the NAND-circuit 52, the flip-flop circuit 45 from being switched by the next following negative curve leg of the discriminator output signal into the state which it assumes in tuning to a true assigned frequency. The flip-flop circuit 45 thus cannot effect the switching from the counter generator 25 to the timing generator 15 after the appearance of a negative curve leg immediately following a positive curve leg in the discriminator output signal. Thus, during the tuning of the input stage 2 toward an image frequency the scan-tuning process is not stopped, but is continued.

But the flip-flop circuit 45 must not remain constantly blocked by the signal at the input of the NAND-circuit 52, otherwise it could not recognize the next negative curve leg which appears during the tuning to a true assigned frequency. Since the blocking of the flip-flop circuit 45 over the NAND-circuit 52 is only cancelled when the flip-flop circuit 46 changes its state again, care must be taken that this flip-flop circuit 46 switches again into the state which it had before recognizing the image frequency after the appearance of a positive leg of the S-curve resulting from the tuning toward an image frequency. This switching of the flip-flop circuit 46 to cancel the blocking of the flip-flop circuit 45 is achieved as follows: The negative curve leg appearing after the positive curve leg which switches the flip-flop circuit 46 for the first time leads to a response of the threshold value circuit 42 and its output signal arrives over the differentiating element 48 and the NAND-circuit 51 with delay over the NAND-circuits 54, 55 and 56 in the flip-flop circuit 46, so that the latter is switched as a reaction thereto. With the switching the signal at the output 61 of this flip-flop circuit 46 also changes, so that the blocking of the flip-flop circuit is cancelled over the NAND-circuit 52. Since the switching of the flip-flop circuit 46 over the NAND-circuits 54, 55 and 56 is effected with delay, the blocking of the flip-flop circuit 45 is only cancelled after the negative curve leg which has led to the response of the threshold value circuit, has died out again. The flip-flop circuit 45 can thus no longer respond to this negative curve leg. The image frequency detector 29 can now respond again in the above described manner to the S-curve which appears in the tuning to a true assigned frequency.

It is now again in the state which it had before the starting signal was applied.

If the input stage 2 was already tuned to an assigned frequency at the start of a tuning process, i.e., when a starting signal was applied at the start-input 38, the discriminator output signal passes first through a positive curve leg. The next negative curve leg appearing in the course of the scan-tuning process would be evaluated as the second half of the S-curve appearing during the reception of an image frequency in the output signal of the discriminator 3, though it is in fact the first curve leg of the S-curve appearing during the reception of an assigned frequency. To make sure that this first positive curve leg does not have any effect at the beginning of the tuning process in the image frequency detector, the flip-flop circuit 47 is provided in the image frequency detector 29. By applying the starting signal to the start-input 38, this flip-flop circuit 47 is switched into a state in which it produces at its input 62 a signal which prevents the flip-flop circuit 46 from switching into a state indicating the recognition of an image frequency. This blocking of the flip-flop circuit 46 is cancelled again by switching the flip-flop circuit 47 only when the threshold value circuit 44 has indicated again that the positive curve leg of the discriminator output signal has been traversed.

Since the passage through a positive curve leg in the S-shaped output signal of the discriminator 3 appearing during the tuning of the input stage 2 to a true assigned frequency can be recognized by whether the signal indicating the level of the received video signal appears at the input 35 and the coincidence signal at the input 34, these signals are evaluated in the image frequency detector 29 in order to prevent a wrong interpretation of a first negative leg curve following a positive curve leg in the discriminator output signal appearing at the start of a tuning process. The flip-flop circuit 47 is switched again into the state in which its output signal at the output 62 effects image frequency recognition by the flip-flop circuit 46, only when the first positive curve leg has been traversed at the start of the tuning process and when the signals at the outputs 34 and 35 have died out. Then the image frequency detector 29 can again perform its intended function of image frequency recognition.

Figure 5:
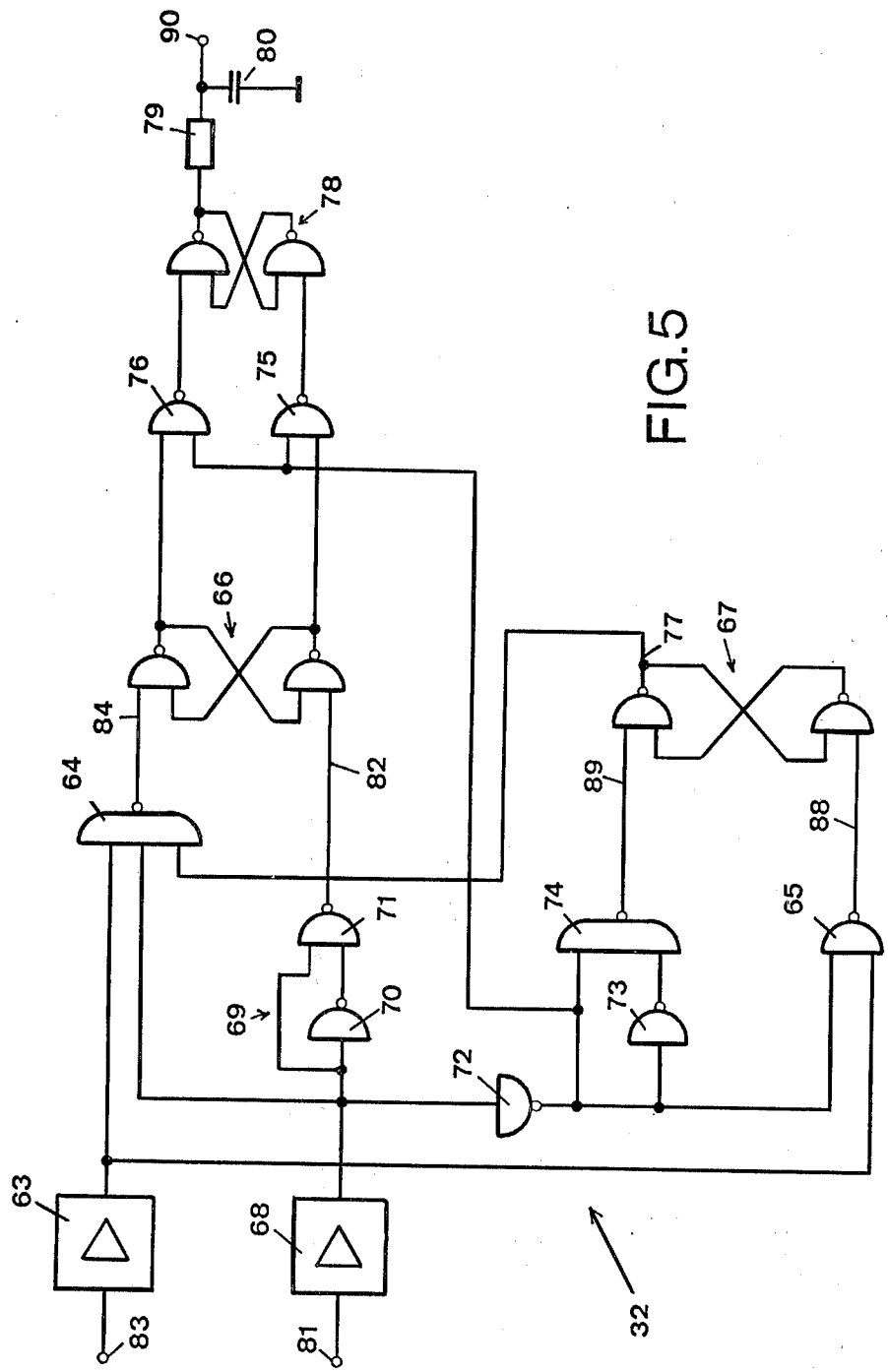
FIG. 5 shows a circuit diagram of a coincidence circuit suitable for use in FIG. 2.

A logic circuit of the coincidence circuit 32 used to determine the coincidence between the synchronizing pulse and the line flyback pulses is represented in FIG. 5. The synchronizing signal is fed over an amplifier 63 to a NAND-circuit 64 and a NAND-circuit 65. The output of the NAND-circuit 64 is connected to the set input 84 of a flip-flop circuit 66 and the output of the NAND-circuit 65 is connected to the reset input 88 of a flip-flop circuit 67.

The line flyback signal is fed over an amplifier 68 to one input of the NAND-circuit 64, a differentiator 69, and an additional NAND-circuit 72. The output of the NAND-circuit 71 is connected to the reset input 82 of the flip-flop circuit 66. The output of the NAND-circuit 72 is connected over the NAND-circuit 65 to the reset input 88 of the flip-flop circuit 67; it is also connected to the NAND-circuits 73 and 74, as well as to the inputs of NAND-circuits 75 and 76, whose additional inputs are connected to the outputs of the flip-flop circuit 66. The output of the NAND-circuit 74 is connected to the set input 89 of the flip-flop circuit 67, whose output is connected 77 to one input of the NAND-circuit 64.

The outputs of the NAND-circuits 75 and 76 are connected to the set- and reset inputs of an additional flip-flop circuit 78 whose output is connected over an RC-element consisting of the resistance 79 and the capacitor 80 to the output 90 of the coincidence circuit 32.

When a line flyback pulse is fed to the input 81 of the coincidence circuit 32, the differentiator 69 produces from the front edge of this pulse a short reset pulse which resets the flip-flop circuit 66. A synchronizing pulse received at the input 83 of the coincidence circuit 32 is fed to one input of the NAND-circuit 64. The synchronizing pulse, however, can only arrive at the set input 34 of the flip-flop circuit 66 when a flyback pulse exists at the input 81 and when the flip-flop circuit 67 is set, so that it produces at its output 77 a signal releasing the NAND-circuit 64.

The flip-flop circuit 67 is set by a pulse which is generated by the two NAND-circuits 73 and 74 and by the rear edge of the line flyback pulse. If a synchronizing pulse appears during the pulse gap between two line feedback pulses, the flip-flop circuit 65 is reset, so that with the next appearing synchronizing pulse the flip-flop circuit 66 cannot be set again after resetting by the front edge of the line flyback pulse.

The alternating setting and resetting of the flip-flop circuit 66 can only be effected if the synchronizing pulse appears during the duration of the line flyback pulse. Any synchronizing pulse appearing outside this duration of the line flyback pulse resets the flip-flop circuit 67, so that setting of the flip-flop circuit 66 is no longer possible. The set state of the flip-flop circuit 66 thus means that the synchronizing pulse appears during the duration of the line flyback pulse, so that synchronous operation is achieved.

To make sure that the output signal of the coincidence circuit 32 does not change its signal value with the change of the switching state of the flip-flop circuit 66, but always has the same signal value in the case of coincidence, the flip-flop circuit 73 is provided, which takes over the state of the flip-flop circuit 66 during the pulse gap between two successive line flyback pulses. Since in synchronous operation the flip-flop circuit 66 always has the same switching state for the duration of this pulse gap, the flip-flop circuit 78 does not change its switching state, so that its output always produces a like signal value.

Since interference pulses appear occasionally in the pulse gaps between the line flyback pulses, even in synchronous operation, these interference pulses may cause a change in the state of the flip-flop circuit 66. As long as the ratio of asynchronously appearing synchronizing pulses to synchronously appearing synchronizing pulses does not exceed a certain percentage, no asynchronous operation signal is required at the output 90. To this end, an integrator comprising the resistance 79 and the capacitor 80 is connected to the output of the flip-flop circuit 78 which compensates these variations of the operating stage of the flip-flop circuit 66 and thus also of the flip-flop circuit 78 and which produces a higher or lower voltage at the output 90 depending on the number of a synchronously appearing synchronizing pulses. If a certain maximum value appears at the output 90, this indicates that all synchronizing pulses have appeared within the line flyback pulses, while a reduction of this voltage indicates that synchronizing pulses have also appeared in the pulse gaps between the line flyback pulses. Only when the voltage at the output 90 has dropped below a certain value and thus indicates that a greater percentage of synchronizing pulses have already appeared asynchronously can the threshold value circuit 33 following the coincidence circuit respond and indicate the asynchronous operating state by its output signal.

The above described circuit arrangement permits the fine tuning of a receiver to an assigned frequency with a short tuning period; the tuning to an assigned frequency is effected without any marked overshooting, so that the circuit arrangement is substantially free from tendency toward oscillation. Its essential components can be produced readily using integrated circuit technique.

What is claimed is:

1. A circuit arrangement for fine tuning a broadcast receiver to an assigned frequency, said receiver including an input stage which can be continuously tuned over a desired frequency range by a variable control voltage fed to a control input of said input stage; said tuning circuit including discriminator means for connection to the output of said input stage and adapted to produce an output signal level varying with the difference between the received frequency and said assigned frequency and having a selected nominal value when said input stage is tuned to a particular assigned transmission frequency; clock generator means responsive to a control signal determined by said discriminator means output signal for generating an output signal having a frequency that varies constantly in dependence on variations of said discriminator output signal from said nominal value; up/down counter means actuated by the output signal of said clock generator means and having a predetermined count when the discriminator output signal has that said nominal value; and digital/analog converter means for converting the count of the counter into a corresponding analog tuning voltage for connection to said control input of said input stage.

2. A circuit arrangement according to claim 1, including comparator circuit means connected between said discriminator means and said clock generator means for comparing said discriminator output signal with a fixed reference signal for generating said control signal on the basis of said comparison.

3. A circuit arrangement for fine tuning a broadcast receiver to an assigned frequency, said receiver including an input stage which can be tuned over a desired frequency range by a variable control voltage fed to a control input of said input stage; said tuning circuit including:

discriminator means for connection to the output of said input stage to produce an output signal level varying with the difference between the received frequency and said assigned frequency and having a selected nominal value when said input stage is tuned to a particular assigned transmission frequency;

clock generator means responsive to a control signal determined by said discriminator means output signal for generating an output signal having a frequency that varies constantly in dependence on variations of said discriminator output signal from said nominal value; said clock generator means including a current source controlled by said control signal; capacitance means connected to said current source; first solid state switching means so connected in parallel with said capacitance means to be switched to a conductive state when said capacitance means is charged to a selected threshold value and to be switched to a non-conductive state when current flow from said current source through said first switch means falls below a preselected holding current value; said first switching means connected to the output of said clock generator means to produce an output signal level thereat depending on the switched state of said switching means;

up/down counter means connected for actuation by the output signal of said clock generator means and having a predetermined count when the discriminator output signal has that said nominal value;

and digital/analog converter means for converting the count of the counter into a corresponding analog tuning voltage for connection to said control input of said input stage.

4. A circuit according to claim 3, wherein said first switching means comprises a complementary transistor pair functionally connected as a four-layer diode.

5. A circuit arrangement according to claim 3, wherein second solid state switching means is connected to parallel with said first switching means and controllable by said first switching means to be switched to a conductive state during the conductive state of said first switching means.

6. A circuit arrangement for fine tuning a broadcast receiver to an assigned frequency, said receiver including an input stage which can be continuously tuned over a desired frequency range by a variable control voltage fed to a control input of said input stage; said tuning circuit including discriminator means for connection to the output of said input state to produce an output signal level varying with the difference between the received frequency and said assigned frequency and having a selected nominal value when said input stage is tuned to a particular assigned transmission frequency, and to generate respective switching signals when said discriminator output signal is in a preselected range above or below said nominal value; up/-down counter means; fixed frequency clock generator means; variable frequency clock generator means responsive to a control signal determined by said discriminator means output signal for generating an output signal having a frequency that varies constantly in dependence in variations of said discriminator output signal from said nominal value; comparator circuit means connected between said discriminator means and said variable frequency clock generator means for comparing said discriminator output signal level with a fixed reference signal for generating said control signal on the basis of said comparison; switch means connected to said comparator circuit means, to said fixed frequency clock generator means, to said variable frequency clock generator means and to said up/down counter means for enabling operation of said counter means by said fixed frequency clock generator means when said discriminator output signal is outside said preselected range above or below said nominal value, for disabling said fixed frequency clock generator means in response to said respective switching signals and for correspondingly applying output signals from said variable frequency clock generator means selectively either to the up-counting input or to the down-counting input of said up/down counter means, said up/down counter means having a predetermined count when the discriminator output signal level has that said nominal value; and digital/analog converter means for converting the count of the counter into a corresponding analog tuning voltage for connection to said control input of said input stage.

7. A circuit arrangement according to claim 6, wherein said receiver input stage includes a signal mixing stage for mixing a received broadcast signal with an output signal from a heterodyne oscillator of said receiver, and wherein said tuner circuit further includes image frequency detector meas connected to said discriminator output for generating a blocking signal when said input stage is tuned to an image frequency, said image frequency detector means also connected to apply said blocking signal to said switching means to prevent switching from said second clock generator means to said first-mentioned clock generator means.

8. A circuit arrangement according to claim 7, wherein said discriminator means is operable to produce an ouput signal having an S-shaped characteristic with a negative curve leg when said input stage is tuned to a frequency value below a selected transmission frequency, and a positive curve leg when the input stage is tuned to a frequency value above said transmitter frequency, said characteristic having a reverse S-curve characteristic when an image frequency is received by said receiver; said image frequency detector means including a first flip-flop circuit for producing in one state an output signal for effecting said switching from said second clock generator means to said first mentioned clock generator means; a first threshold value circuit connected between said discriminator output and said first flip-flop circuit to switch said first flip-flop circuit to a state in which it produces said switching signal, when said discriminator output signal includes said negative curve leg; a second flip-flop circuit connected to receive said switching signal as a blocking signal; a second threshold value circuit connected between said discriminator output and said second flip-flop circuit to respond to a discriminator output signal including said positive curve leg and switch said second flip-flop circuit, if unblocked, into a state in which it produces a signal for holding said first flip-flop circuit in a state in which it produces said blocking signal.

9. A circuit arrangement according to claim 8, wherein said broadcast receiver is a television receiver including means for generating synchronizing pulses and line flyback pulses; and wherein said tuner circuit includes a coincidence circuit responsive to coincidence of said synchronizing and line flyback pulses to generate a coincidence signal; said image frequency detector including a third flip-flop circuit connected for response to concurrent inputs comprising said coincidence signal, said discriminator output signal including said positive curve leg and a signal indicative of the level of received video signal to produce an output signal for blocking said second flip-flop circuit.

10. A circuit arrangement according to claim 9, wherein said coincidence circuit includes a fourth flip-flop circuit connected to produce a set output indicating coincidence between a said synchronizing pulse and a said line flyback pulse, said fourth flip-flop connected for resetting by the front edge of said line flyback pulse; a logic circuit connected to said fourth flip-flop circuit and responsive only to concurrence of (1) a synchronizing pulse, (2) a said line flyback pulse to switch said fourth flip-flop circuit from a reset to a set state; and a fifth flip-flop circuit switchable to a set state by the rear edge of said line flyback pulse, and to a reset state by a synchronizing pulse occurring outside the line flyback pulse period.

11. A circuit arrangement according to claim 10 further including a slave flip-flop circuit connected with said fourth flip-flop circuit to assume the state of said fourth flip-flop circuit in response to a signal indicating the absence of a said line flyback pulse, said slave circuit having an output connected to the output of said coincidence circuit.

12. In a television broadcast receiver having an input stage continuously tunable over a desired frequency range by a variable control voltage fed to a control input of said input stage, and a signal mixing stage for mixing received broadcast signals with an output signal from a heterdyne oscillator; the improvement comprising a tuning circuit for fine tuning said receiver to an assigned frequency within said desired frequency range; said tuning circuit including signal discriminator means connected to the output of said input stage and adapted to produce an output signal having a substantially S-shaped characteristic with a negative curve leg when said input stage is tuned to a frequency value below a selected assigned frequency, a positive curve leg when said input stage is tuned to a frequency value above said assigned frequency, and to produce an output signal having a selected nominal value when said input stage is tuned to an assigned frequency, said output signal further having a reverse S-curve characteristic when an image frequency is received by said receiver; and said discriminator circuit further being operable to generate respective clock generator switching signals when said discriminator output signal is in a preselected range above or below said nominal value; first controllable clock generator means responsive to a control signal, comparator circuit means connected between said discriminator means and said first clock generator means for comprising said discriminator output signal with a fixed reference signal for generating said control signal with a value dependent upon the difference between said discriminator output signal from said nominal value such that said first clock generator means produces a counter control signal having a frequency that varies constantly in dependence on variations of said discriminator output signal from said nominal value; up/down counter means actuated by said counter control signal such that said counter output signal has a predetermined reference value when the discriminator output signal has said nominal value; second clock generator means having a constant clock frequency connected to said up/down counter means; switch means connected between said first clock generator means and said up/down counter for disabling said second clock generator means in dependence on said clock generator switching signal and for applying said counter control signals selectively either to the up-counting or to the down-counting input of said up/down counter means; image frequency detector means connected to said discriminator output for generating a blocking signal when said input stage is tuned to an image frequency; said image frequency detector also connected for selectively applying said blocking signal to said switching means to prevent switching from said second clock generator to said first clock generator; said image frequency detector including first solid state switch circuit responsive to said negative curve leg of said discriminator output to produce an output switching signal for effecting switching from said second clock generator to said first clock generator, second solid state switch circuit connected to receive said output switching signal as a disabling signal, said second solid state switch circuit responsive to said positive curve leg of said discriminator output, if not disabled, to produce a signal for holding said first switch circuit in a state in which it produces said disabling signal.

* * * * *